United States Patent [19]
Takahashi

[11] Patent Number: 6,073,856
[45] Date of Patent: Jun. 13, 2000

[54] NONCONTACT IC DEVICE

[75] Inventor: Norio Takahashi, Tokyo, Japan

[73] Assignee: DAI Nippon Printing Co., Ltd., Japan

[21] Appl. No.: 09/146,536

[22] Filed: Sep. 3, 1998

[30] Foreign Application Priority Data

Sep. 5, 1997 [JP] Japan .................................. 9-256185
Oct. 23, 1997 [JP] Japan .................................. 9-308074

[51] Int. Cl.[7] ........................... G06K 7/06; G06K 19/06
[52] U.S. Cl. .......................................... 235/492; 235/441
[58] Field of Search ................................. 235/492, 375, 235/486, 488

[56] References Cited

U.S. PATENT DOCUMENTS

| | | | |
|---|---|---|---|
| 4,451,903 | 5/1984 | Jordan | 235/492 |
| 4,692,601 | 9/1987 | Nakano | 235/380 |
| 5,168,151 | 12/1992 | Nara | 235/492 |
| 5,821,525 | 10/1998 | Takebayashi | 235/492 |
| 5,889,273 | 3/1999 | Goto | 235/492 |

*Primary Examiner*—Thien M. Le
*Attorney, Agent, or Firm*—Parkhurst & Wendel, L.L.P.

[57] ABSTRACT

A noncontact IC card is provided with an antenna coil, an IC chip and a short-circuiting circuit formed on a base card. The noncontact IC card is kept inoperative unless the short-circuiting circuit is opened and the noncontact IC card is rendered operative when the short-circuiting circuit is opened. The short-circuiting circuit is formed to extend across a main part and a removable identification part included in the base card. The short-circuiting circuit can be opened by removing the identification part from the base card.

41 Claims, 9 Drawing Sheets

NONCONTACT IC DEVICE

BACKGROUND OF THE INVENTION

1. Field of the Invention

The present invention relates to a noncontact IC device, such as a noncontact IC card, capable of exchanging data with an external reader/writer in a noncontact communication mode and, more particularly, to a noncontact IC device capable of being easily changed from an unused state to a used state.

2. Description of the Related Art

IC cards provided with terminals have prevalently been used particularly in France as prepaid telephone cards because of their high ability to prevent the dishonest alteration of information stored therein as compared with magnetic cards.

It is difficult to discriminate between a used state and an unused state of a prepaid IC card provided with terminals, like a telephone card. Unused prepaid IC cards must be identified not only by coupon shops but also by purchasers.

Prepaid telephone cards having 0.25 mm in thickness of a magnetic recording system are used in Japan. The start of use of this prepaid telephone card and an approximate number of remaining message units are indicated by holes formed by punching in the telephone card. Generally, the thickness of IC cards is as great as 0.76 mm. Therefore it is not easy to punch holes in IC cards and IC cards are not used as prepaid telephone cards.

When an IC card provided with terminals is used as a telephone card, the IC card sealed in a film envelope is sold, and the film envelope is cut and the IC card is taken out of the film envelope when the IC card is used for the first time. Thus it is considered that an IC card wrapped in an unsealed film envelope at the least is not an unused IC card and that an IC card perfectly sealed in a film envelope is an unused IC card.

Noncontact IC cards capable of sending data to and receiving data from an external device in a noncontact communication mode by using electromagnetic radiation have been used in recent years. The noncontact IC card does not need to be physically connected to an external device by using contacts, which is needed by the IC card provided with terminals. Since the noncontact IC card exchanges radio messages with the external device, the noncontact IC card sealed in an envelope can be used without being taken out of the envelope. Accordingly, it is impossible to discriminate between a used state and an unused state of the noncontact IC card wrapped in an envelope only from the condition of the envelope. The noncontact IC card may be wrapped in an envelope having an electromagnetic shielding effect to enable the discrimination between a used state and an unused state of the noncontact IC card from the condition of the envelope, which, however, is expensive and is incapable of preventing the dishonest selling of used noncontact IC cards wrapped in a false envelope similar in appearance to a genuine envelope at coupon shops.

SUMMARY OF THE INVENTION

Accordingly, it is an object of the present invention to provide a noncontact IC device capable of being easily changed from an unused state to a used state, and to provide a noncontact IC device enabling the reliable discrimination between a used state and an unused state thereof.

According to one aspect of the present invention, a noncontact IC device comprises: a base card; an IC chip mounted on the base card; an antenna coil formed on the base card and connected to the IC chip; and a short-circuiting circuit capable of disabling the IC chip for operation when closed and of enabling the IC chip to operate when opened.

The base card may have a main part, a removable identification part, and a breaking part provided with folding grooves and connecting the main part and the identification part, the IC chip and the antenna coil may be placed in the main part, and a part of the short-circuiting circuit may be formed in the identification part.

The IC chip and the antenna coil may integrally be sealed in a resin.

The short-circuiting circuit may have an open circuit provided with a pair of conductive lines, and a connecting part located between the pair of conducutive lines of the open circuit and capable of closing the open circuit when necessary.

The short-circuiting circuit may be formed entirely of a solder paste having electrical resistance which is reduced when the solder paste is melted and then solidified.

A part of the short-circuiting circuit may be placed on the surface of the base card.

The short-circuiting circuit may be formed of a volatile material which can be cut with a laser beam.

In the noncontact IC device of the present invention, the short-circuiting circuit is closed to disable the IC chip for operation in an unused state, and the short-circuiting circuit is opened to enable the IC chip to operate.

DESCRIPTION OF THE PREFERRED EMBODIMENTS

First Embodiment

Figure 1:
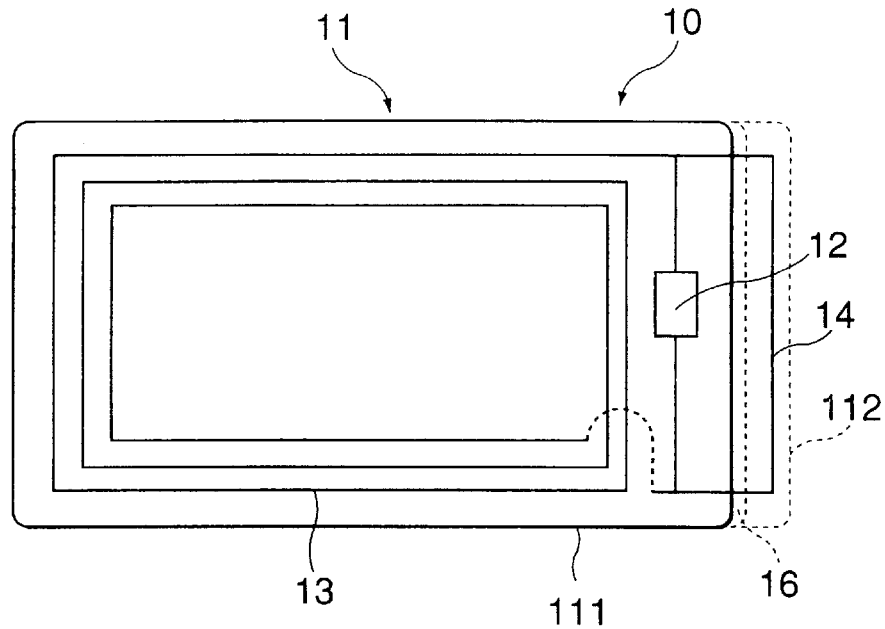
FIG. 1 is a circuit diagram of a noncontact IC device in a first embodiment according to the present invention.

Referring to FIG. 1 showing, by way of example, a noncontact IC card 10, i.e., a noncontact IC device, in a first embodiment according to the present invention, the noncontact card 10 has a base card 11 having a main part 111 and a removable identification part 112, an IC chip 12 mounted on the main part 111 of the base card 11, and an antenna coil 13 formed on the main part 111. The base card 11 is not provided on its surface with any terminals to be connected to an external device. The noncontact IC card is an IC card of a radio communication system capable of writing data to and reading data from an external device by using an electric field or a magnetic field. The noncontact IC card 10 of the present invention features a short-circuiting circuit 14 formed in one end of the main part 111 and the identification part 112, and connected to the opposite ends of the IC chip 12. No current flows through the antenna coil 13 and the IC chip 12 is unable to communicate with the outer device while the short-circuiting circuit 14 is continuous, i.e., closed, and hence the IC chip 12 remains inoperative. The IC chip 12 is able to operate for communication with the external device and hence the noncontact IC card 10 is able to function if the short-circuiting circuit 14 is opened,. There are various methods of opening the short-circuiting circuit 14. For example, part of the short-circuiting circuit 14 is formed on the surface of the base card 11, and the part formed on the surface of the base card 11 may be cut with a knife, or the short-circuiting circuit 14 may be formed of a volatile material and the short-circuiting circuit 14 may be broken with a laser beam.

A preferable method of breaking the short-circuiting circuit 14 will be described below. The base card 11 has the main part 111, the identification part 112, and a breaking part provided with folding grooves 16 and extending between the main part 111 and the identification part 112. The short-circuiting circuit 14 has a part extended on the identification part 112. The identification part 112 is bent along the folding grooves 16 to separate the identification part 112 from the main part 111 and to remove the part of the short-circuiting circuit 14 formed on the identification part 112 from the part of the same formed on the main part 111 so that the short-circuiting circuit 14 is broken. In FIG. 1 the identification part 112 separated from the main part 111 is indicated by broken lines. When the identification part 112 is thus separated from the main part 111, the part of the short-circuiting circuit 14 formed on the identification part 112 is disconnected from that of the same formed on the main part 111.

Figure 2:
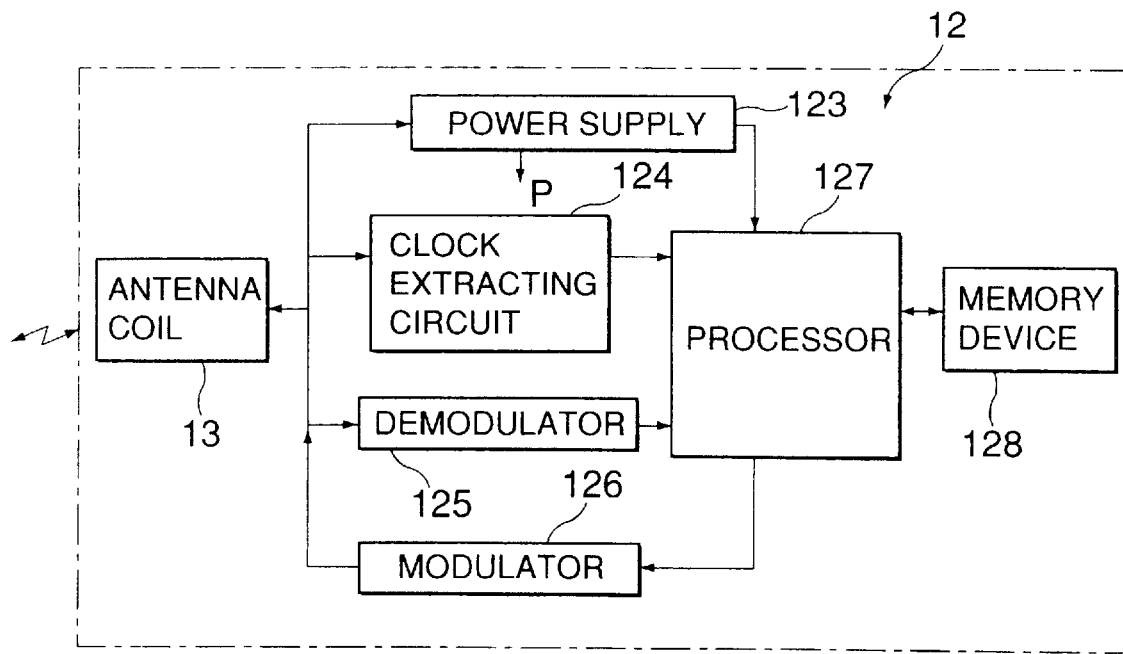
FIG. 2 is a block diagram of a circuit included in an IC card including an antenna coil.

Referring to FIG. 2, the noncontact IC card 10 has an electronic circuit comprising the antenna coil 13 and the IC chip 12. The IC chip 12 comprises a power supply 123, a clock extracting circuit 124, a demodulator 125, a modulator 126, a processor 127 and a memory device 128. The respective inputs and the outputs of the power supply 123, the clock extracting circuit 124 and the demodulator 125 of the IC chip 12 are connected to the antenna coil 13 and the processor 127, respectively. The output of the processor 127 is connected to the input of the modulator 126, and the output of the modulator 126 is connected to the antenna coil 13. The memory device 128 is connected to the processor 127.

The antenna coil 13 is used, both for signal transmission and signal reception; that is, electromagnetic waves expressing data are received from an external reader/writer, power is received and data is transmitted to the reader/writer through the antenna coil 13. The power supply 123 supplies power for driving the clock extracting circuit 124, the demodulator 125, the modulator 126 and the processor 127. The clock extracting circuit 124 having the input connected to the antenna coil 13 supplies a clock signal to the processor 127. The demodulator 125 having the input connected to the antenna coil 13 gives demodulated signals which are obtained at the demodulator 125 by modulating signals received from the reader/writer to the processor 127. The processor 127 comprises, for example, a microcomputer. The processor 127 is initialized by a signal given thereto by the power supply 123, and uses the clock signal given thereto by the clock extracting circuit 124 for the synchronization of signal processing operations for transmission control, reception control, memory access control and data processing. The processor 127 controls operations for receiving data, and write data to the memory device 128, and operations for reading data from the memory device 128, giving the data to the modulator 126 and transmitting the modulated data through the antenna coil 13 to the reader/writer.

The noncontact IC card 10 of the present invention may be an IC card of any kind provided that the noncontact IC card is capable of transmitting signals to and receiving signals from an external reader/writer in a noncontact mode using an electric field, electromagnetic field or a magnetic field. For example, the noncontact IC card 10 may be provided with separate antenna coils, respectively, for receiving power, data reception and data transmission, instead of the single antenna coil 13 used for both signal transmission and signal reception. The size of the antenna coil 13 is dependent on that of the noncontact IC card 10. There is no particular restriction on the shape of the antenna coil 13; the antenna coil 13 may be formed in the shape of a coin or in a rectangular shape in the peripheral region of the base card 11 as shown in FIG. 1. There is no particular restriction on the method of forming the antenna coil 13; the antenna coil 13 may be formed, for example, by winding a wire, by etching a printed conductive film or by printing conductive ink. The noncontact IC card 10 may be provided with a built-in battery or a built-in solar battery instead of the power supply 123, to which power is supplied from an external power source in a noncontact mode.

The noncontact IC card 10 is suitable for use as an admission card for the management of entrance into and exit from a restricted room, a control card for production control, a railroad or highway ticket or a card for monetary transactions. The noncontact IC card 10 is particularly suitable for use as a prepaid card, such as a prepaid telephone card. A prepaid card stores data corresponding to a fixed amount of money, and the data is automatically adjusted every time the prepaid card is used for buying articles, borrowing money or using a service.

These operations are achieved through the remote electromagnetic coupling of the electronic device of the noncontact IC card 10, and an external receiver or an external reader.

Figure 3:
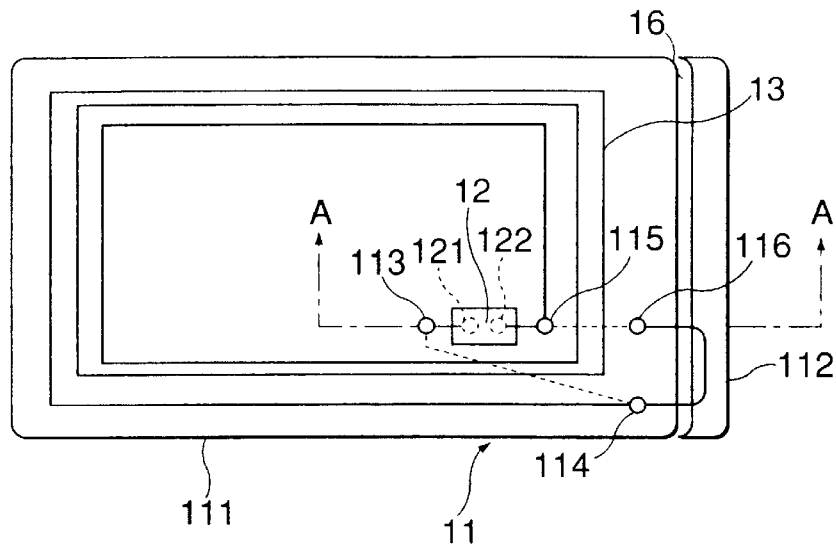
FIG. 3(A) is a plan view of a noncontact IC card.
FIG. 3(B) is a sectional view taken on line A—A in FIG. 3(A)
FIG. 3(C) is a perspective view of the noncontact IC card of FIG. 3(A)
Figure 3:
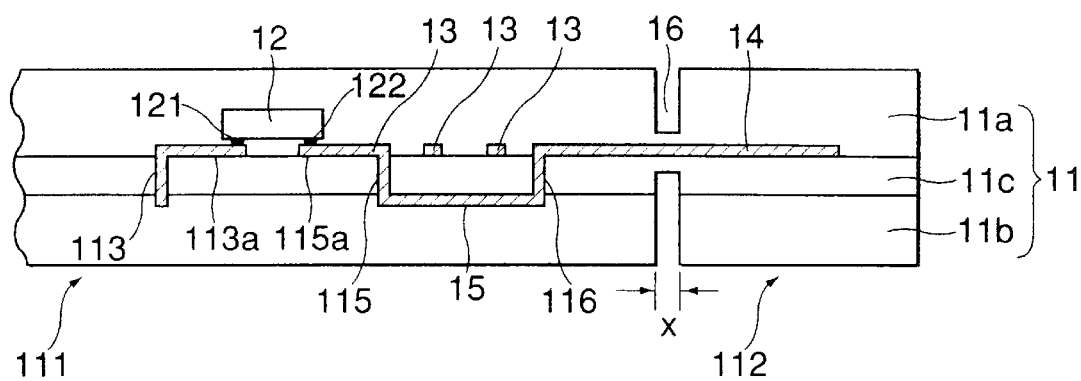
Figure 3:
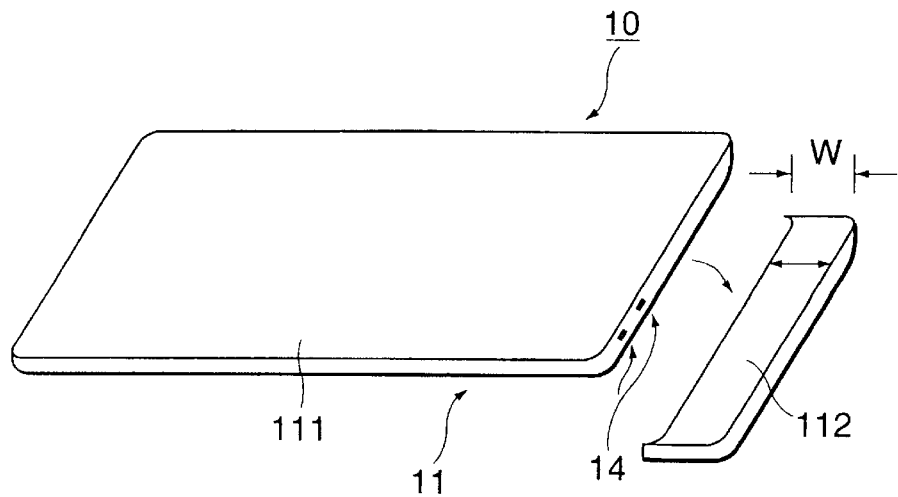
Figure 4:
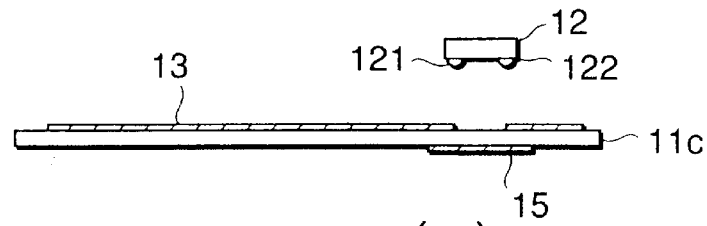
FIGS. 4(A) to 4(D) are views of assistance in explaining a noncontact IC card manufacturing process.
Figure 4:
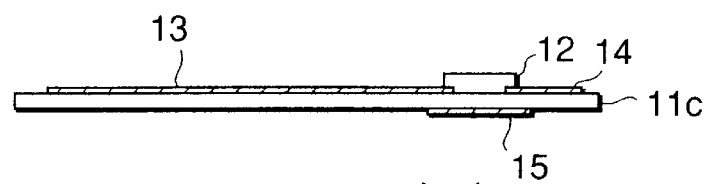
Figure 4:
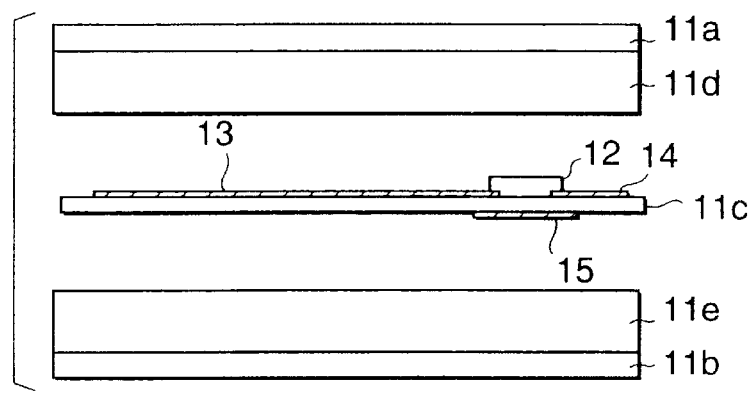
Figure 4:
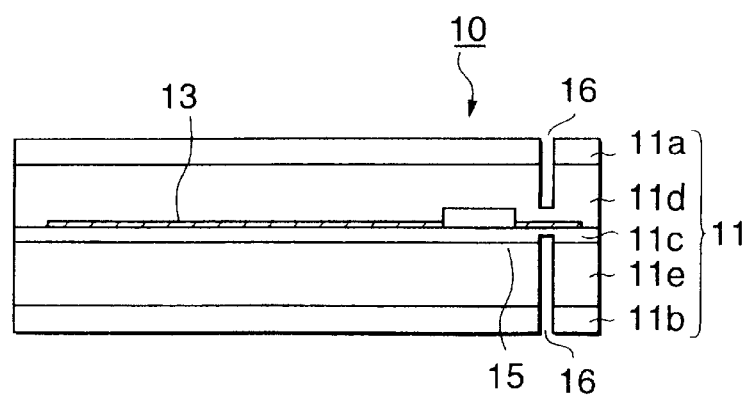

FIGS. 3(A) to 3(C) illustrate the construction of the noncontact IC card 10 of FIG. 1. As shown in FIG. 3(A), the base card 11 of the noncontact IC card 10 is formed by laminating an upper sheet 11a, a middle sheet 11c and a lower sheet 11b, and has the main part 111, the identification part 112, and the breaking part provided with the folding grooves 16 and extending between the main part 111 and the identification part 112. The folding grooves 16 are formed to reduce the thickness of a part of the base card 11 to form the breaking part which can easily be broken. A perforated line may be formed instead of the grooves 16 in the breaking part. The IC chip 12 is mounted on the main part 111. A first bump 121, i.e., one of the bumps, of the IC chip 12 is connected via through holes 113 and 114 to one end of the antenna coil 13 and a second bump 122, i.e., the other bump, of the IC chip 12 is connected via a through hole 115 to the other end of the antenna coil 13. The IC chip 12 and the antenna coil 13 are formed on the middle sheet 11c and concealed from view.

FIG. 3(B) is an enlarged typical sectional view taken on line A—A in FIG. 3(A). Referring to FIG. 3(B), printed wiring lines are formed on the middle sheet 11c and the upper sheet 11a and the lower sheet 11b are attached to the upper and the lower surface of the middle sheet 11c, respectively. The IC chip 12 is provided on its surface facing the middle sheet 11c with the bumps 121 and 122. The first bump 121 and the contact terminal 113a of the middle sheet 11c are connected by wire bonding using bonding wires or an anisotropic conductive film. The second bump 122 of the IC chip 12 is connected to a terminal 115a connected to the antenna coil 13. The second bump 122 is connected via through holes 115 and 116 to the short-circuiting circuit 14. The first bump 121 is connected to a terminal 113a which in turn is connected via the through holes 113 and 114 to the short-circuiting circuit 14.

The short-circuiting circuit 14 is formed in a part of the middle sheet 11c. The short-circuiting circuit 14 may be formed on either the upper surface, i.e., the surface on the side of the IC chip 12, or the lower surface, i.e., the surface on the opposite side of the IC chip 12, of the middle sheet 11c. If the short-circuiting circuit 14 is formed on the lower surface of the middle sheet 11c, the number of through holes can be reduced.

The folding grooves 16 are formed in an appropriate depth so that the identification part 112 can easily be separated from the main part 111 and the short-circuiting circuit 14 is not broken by the folding grooves 16. If a perforated line is used instead of the folding grooves 16, the perforated line must be formed so that the short-circuiting circuit 14 is not broken by perforations.

The IC chip 12 is surrounded by the antenna coil 13 in a configuration illustrated in FIGS. 3(A) and 3(B), and the chip 12 located beside the antenna coil 13 in a configuration illustrated in FIG. 1. Those configurations are the same in functions. The configuration shown in FIG. 1 1n which the IC chip 12 is located beside the antenna coil 13 facilitates the connection of the IC chip 12 and the short-circuiting circuit 14, and requires fewer of through holes. 5 FIG. 3(C) is a perspective view of the noncontact IC card 10 prepared for use by separating the identification part 112 from the main part 111. The main part 111 is held fast and the identification part 112 is bent along the folding grooves 16 to separate the identification part 112 from the main part 111. Consequently, the short-circuiting circuit 14 is broken, and the original communicating function of the noncontact IC card 10 becomes available. Sections of the broken lines of the short-circuiting circuit 14 is are exposed in a section on the main part 111 formed by separating the identification part 112 from the main part 111. The identification part 112, once separated from the main part 111, cannot be connected as it was before to the main part 111, and hence the noncontact IC card 10 not having the identification part 112 can never be sold as an unused noncontact IC card.

A method of fabricating the noncontact IC card 10 will be described hereinafter with reference to FIGS. 4(A) to 4(D).

Referring to FIG. 4(A), the antenna coil 13, necessary circuits including the short-circuiting circuit 14, the through holes 115 and 116, and a connecting circuit 15 are formed on the middle sheet 11c. The IC chip 12 is connected to the antenna coil 13 and the short-circuiting circuit 14 as shown in FIG. 4(B). The IC chip 12 can be connected to the antenna coil 13 and the short-circuiting circuit 14 by wire bonding using bonding wires or an anisotropic conductive film. Then, the upper sheet 11a and the lower sheet 11b are laminated to the upper and the lower surface of the middle sheet 11c, respectively. As shown in FIG. 4(C), adhesive layers 11d and 11e may be formed on the upper sheet 11a and the lower sheet 11b beforehand to facilitate laminating the upper sheet 11a and the lower sheet 11b to the middle sheet 11c.

When laminating the upper sheet 11a and the lower sheet 11b to the middle sheet 11c, the middle sheet 11c is sandwiched between the upper sheet 11a and the lower sheet 11b to form a layered structure, and the layered structure is subjected to a hot melt lamination process. Thus, as shown in FIG. 4(D) the noncontact IC card 10 provided with the IC chip 12 embedded in the base card 11 formed by laminating the upper sheet 11a, the lower sheet 11b and the middle sheet 11c is fabricated.

Since the thickness of the IC chip 12 is in the range of 50 to 200 $\mu$m, the thickness of the IC chip 12 is absorbed by the upper sheet 11a, and the IC chip scarcely 12 affects the appearance of the noncontact IC card 10. If the upper sheet 11a and the lower sheet 11b are laminated to the middle sheet 11c with the adhesive layers 11d and 11e, respectively, the thickness of the IC chip 12 can easily be absorbed by the adhesive layer 11d.

The middle sheet 11c provided with the printed circuits can be fabricated by a known method comprising a step of forming the antenna coil 13 and the terminals 113a and 115a by forming conductive films, such as aluminum films, on both the surfaces of the middle sheet 11c by plating, and etching the conductive films by a photolithographic etching process, a step of forming the through holes 113, 114, 115 and 116, and connecting the circuits formed on the upper and the lower surface of the middle sheet 11c via the through holes 113, 114, 115 and 116. The connecting circuit 15 is formed on the lower surface of the middle sheet 11c opposite the upper surface of the same on which the IC chip 12 is attached to avoid contact between the connecting circuit and the antenna coil 13. The aluminum film forming the connecting circuit 15 may be of a relatively small area because the connecting circuit 15 has a relatively small area. The connecting circuit 15 may be formed by applying a conductive material with a dispenser to the middle sheet 11c.

The folding grooves 16 are formed in the laminated base card 11 by pressing, spot facing or half punching. Folding grooves 16 may be formed in both the opposite surfaces of the base card 11 as shown in FIG. 4(D). The breaking part provided with the folding grooves 16 may accidentally be broken if the thickness of the breaking part is excessively small. The identification part 112 cannot easily be separated from the main part 111 and the irregular section may be formed on the main part 111 when the identification part 112 is separated from the main part 111 1f the thickness of the breaking part is excessive. It is known empirically that the thickness of a preferable breaking part provided with the folding grooves 16 is in the range of 0.1 to 0.3 mm. Although the identification part 112 may be formed in an optional width, a suitable value of the width W (FIG. 3(C)) of the identification part 112 is in the range of 0.5 to 20 mm because the identification part 112 must be able to be nipped between fingertips. Generally, a plurality of noncontact IC cards are formed in a sheet, and then the sheet is cut into the plurality of individual noncontact IC cards by punching.

Figure 5A:
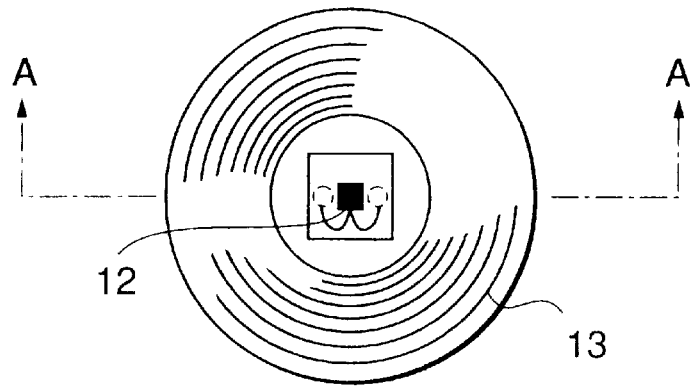
FIG. 5(A) is a plan view of an coil-shaped IC module.
Figure 5B:
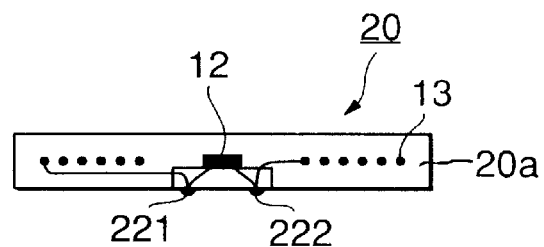
FIG. 5(B) is a sectional view taken on line A—A in FIG. 5(A)

A noncontact IC card, in a modification of the noncontact IC card 10, may be provided with an IC module 20 formed by sealing electronic parts including the IC chip 12 and the antenna coil 13 in a thermosetting resin 20a, such as an epoxy resin, as shown in FIGS. 5(A) and 5(B). Generally, the IC module 20 is formed in a structure having the shape of a coin or disc and opposite flat surfaces. FIG. 5(A) shows the IC chip 12 and the antenna coil 13 before sealing the same in the thermosetting resin 20a, and FIG. 5(B) is a sectional view of the IC module 20 corresponding to a sectional view taken on line A—A in FIG. 5(A).

An IC module for an ordinary noncontact IC card is not provided with any terminals. The IC module 20 for the noncontact IC card 10 of the present invention is provided with terminals 221 and 222 to be connected to the short-circuiting circuit 14. The terminals 221 and 222 are connected to the connecting circuit 15.

Figure 6:
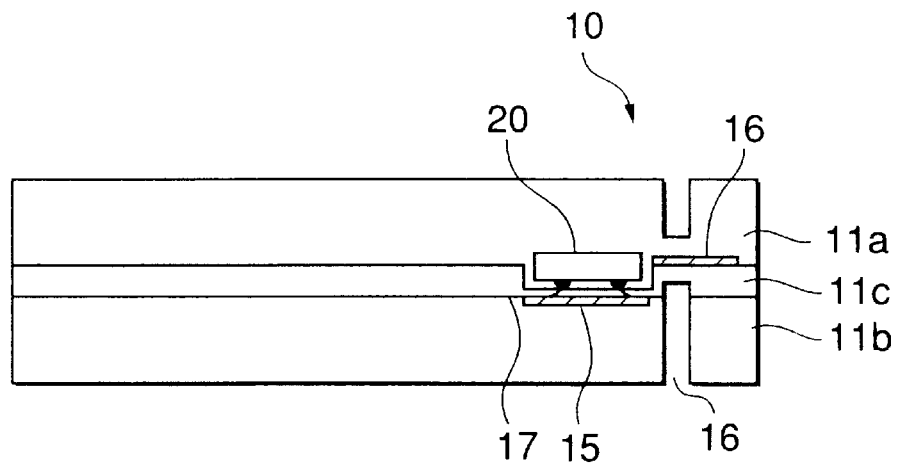
FIG. 6 is a typical sectional view of assistance in explaining a method of forming a base card by laminating component layers when an IC module is employed.

FIG. 6 shows the construction of a base card 11 to be used in combination with the IC module 20. Since the IC module 20 has a thickness in the range of about 0.4 to about 0.5 mm, it is preferable to form a recess 17 for receiving the IC module in the middle sheet 11c by spot facing or the like before laminating the upper sheet 11a to the middle sheet 11c. The IC module 20 may be bonded to the middle sheet 11c by, for example, a cyanoacrylate-base adhesive or a thermosetting resin adhesive.

The noncontact IC card 10 shown in FIG. 6 is provided with the IC module 20 internally provided with the antenna coil 13. Therefore, the antenna coil 13 need not be formed on the middle sheet 11c.

Resins suitable for forming the upper sheet 11a, the lower sheet 11b and the middle sheet 11c are weldable resins including polyvinyl chloride resins, polyethylene resins, polypropylene resins, polystyrene resins, ABS resins, acrylic resins, polyamide resins, polyimide resins and the like. When the upper sheet 11a, the lower sheet 11b and the middle sheet 11c are sheets of a nonweldable polyester resin or a nonweldable polycarbonate resin, the upper sheet 11a, the lower sheet 11b and the middle sheet 11c can be laminated by using an adhesive to construct the base card 11.

EXAMPLE

An example of the noncontact IC card 10 will be described with reference to FIGS. 3, and 4(A) to 4(D). It is presumed that thirty noncontact IC cards 10 are formed in five rows and six columns on a base sheet. Aluminum films of 20 $\mu$m in thickness for forming the antenna coils 13 and the connecting circuit 15 were formed on both the surfaces, respectively, of a 25 $\mu$m thick polyethylene terephthalate film by an electroless plating process and a subsequent electroplating process. The aluminum film formed on the upper surface, i.e., a surface on which IC chips 12 are to be mounted, was subjected to a photolithographic etching process to form the antenna coils 13 and the terminals 113a and 115a to which IC chips 12 are to be connected. Each of the antenna coils 13 was formed by winding a 160 $\mu$m wide line in four turns at intervals of 160 $\mu$m on the middle sheet 11c of the base card 11. The connecting circuits 15 were formed by processing the aluminum film formed on the other surface of the middle sheet 11c. The through holes 113, 114, 115 and 116 were formed in the middle sheet 11c, and the surfaces of the through holes 113, 114, 115 and 116 were coated with a conductive film by plating. IC chips 12 provided with a 64-byte memory device were bonded to the terminals 113a and 115a formed on the middle sheet 11c by applying heat and pressure to the bumps 121 and 122 of the IC chips 12 with a heater head. The base sheet can be divided into thirty base cards 11.

Polyethylene terephthalate films for forming the upper sheets 11a and the lower sheets 11b were coated with a 280 $\mu$m thick layer of a polyester adhesive. The polyethylene terephthalate sheet for forming the middle sheets 11c mounted with the IC chips 12 was sandwiched between the polyethylene terephthalate films coated with the polyester adhesive for forming the upper sheets 11a and the lower sheets 11b to form a layered sheet structure. The layered sheet structure was heated at 150° C. and pressed at 25 kg/cm$^2$ for 15 min by a hot press for a laminating process to form a laminated sheet structure of 760 $\mu$m in thickness. Grooves 16 of 0.16 mm in depth and 0.5 mm in width were formed in the upper surface of the laminated sheet structure, and grooves 16 of 0.30 mm in depth and 0.5 mm in width were formed in the lower surface of the laminated sheet structure by spot facing. The short-circuiting circuits 14 were embedded in the laminated sheet structure, i.e., the base sheet. Thus, 0.3 mm thick breaking parts and the identification parts 112 of 10 mm in width W were formed. Then, the laminated sheet structure provided with the grooves 16 was divided by punching into the noncontact IC cards 10 each having the base card 11 having the main part 111 and the identification part 112. The noncontact IC cards thus fabricated were tested. The noncontact IC cards 10 each having the identification part 112 were inoperative, and the same became operative when the identification parts 112 thereof were separated therefrom.

The noncontact IC card 10 of the present invention is provided with the short-circuiting circuit 14 which disables the IC chip 12 for communication with an external device. Therefore, the circuits of the noncontact IC card 10 are unable to function, the circuits of the noncontact IC card 10 may not be caused to malfunction by an external magnetic field during transportation and before an authorized user starts using the noncontact IC card 10 and the original data stored in the noncontact IC card 10 can be retained perfectly as long as the short-circuiting circuit 14 is closed. The short-circuiting circuit 14 can easily be opened by separating the identification part 112 from the main part 111 to start using the noncontact IC card 10.

The unused state of the noncontact IC card 10 can exactly be identified from the identification part 112 carrying a part of the short-circuiting circuit 14 and connected to the main part 111. The identification part 112 once separated from the main part 111 cannot be connected as it was before to the main part 111, and hence the used state of the noncontact IC card 10 not having the identification part 112 can easily be identified. Accordingly, the buyer is able to avoid being swindled by buying a used noncontact IC card 10 as a unused noncontact IC card 10, and is able surely to buy a unused noncontact IC card 10.

Although the present invention has been described as embodied in the noncontact IC card, the noncontact IC device may be of any shape provided that the noncontact IC device is provided with an IC chip embedded therein, such as a noncontact IC device having the shape of a notebook or a label.

Second Embodiment

A noncontact IC card in a second embodiment according to the present invention will be described with reference to FIGS. 7 to 14(D), in which parts like or corresponding to those shown in FIGS. 1 to 6 are designated by the same reference characters and the description thereof will be omitted.

Figure 7:
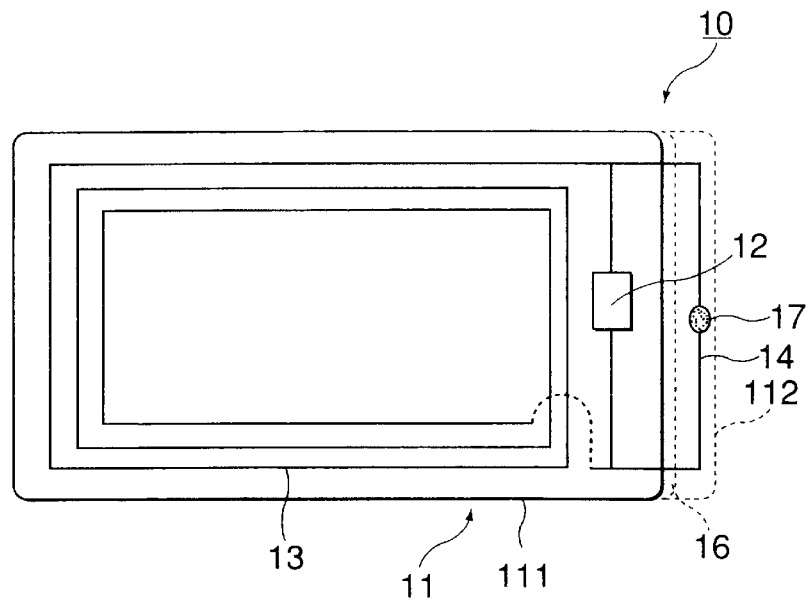
FIG. 7 is a circuit diagram of a noncontact IC device in a second embodiment according to the present invention.

Referring to FIG. 7, a noncontact IC card 10, i.e., a noncontact IC device, in a second embodiment according to the present invention has a base card 11 having a main part 111, a removable identification part 112 and a breaking part provided with folding grooves 16 and connecting the main part 111 and the identification part 112. An IC chip 12 is mounted on the main part 111 of the base card 11, and an antenna coil 13 is formed on the main part 111.

The noncontact IC card 10 features a short-circuiting circuit 14 formed in one end of the main part 111 and the identification part 112, and connected to the opposite ends of the IC chip 12. The short-circuiting circuit 14 has a connecting part 17 having a high resistance sufficient to keep the short-circuiting circuit 14 in an open state and capable of being reduced to set the short-circuiting circuit 14 in a closed state. The short-circuiting circuit 14 is in an open state while the connecting part 17 is in an initial state, i.e., a nonconductive state, and the short-circuiting circuit 14 is set in a closed state when the connecting part 17 is set in a conductive state. Current does not flow through the antenna coil 13 having a resistance higher than that of the connecting part 17 in a conductive state, and the noncontact IC card 10 is unable to communicate with an external device while the short-circuiting circuit 14 is closed. When the connecting part 17 is set in a nonconductive state to open the short-circuiting circuit 14, the noncontact IC card 10 is able to function.

There are various methods of opening the short-circuiting circuit 14. For example, a part of the short-circuiting circuit 14 is formed in the identification part 112 of the base card, and the identification part 112 maybe separated from the main part 111 by bending the identification part 112 along the folding grooves 16. In FIG. 7, the identification part 112 separated from the main part 111 is indicated by broken lines.

Figure 8:
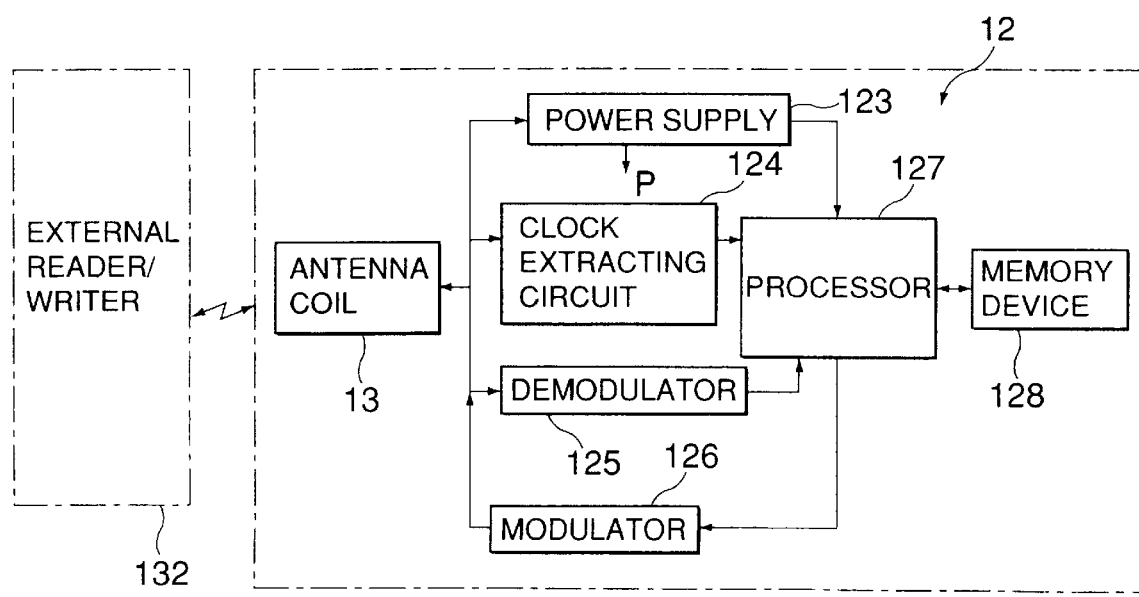
FIG. 8 is a block diagram of a circuit included in an IC card including an antenna coil.
Figure 9:
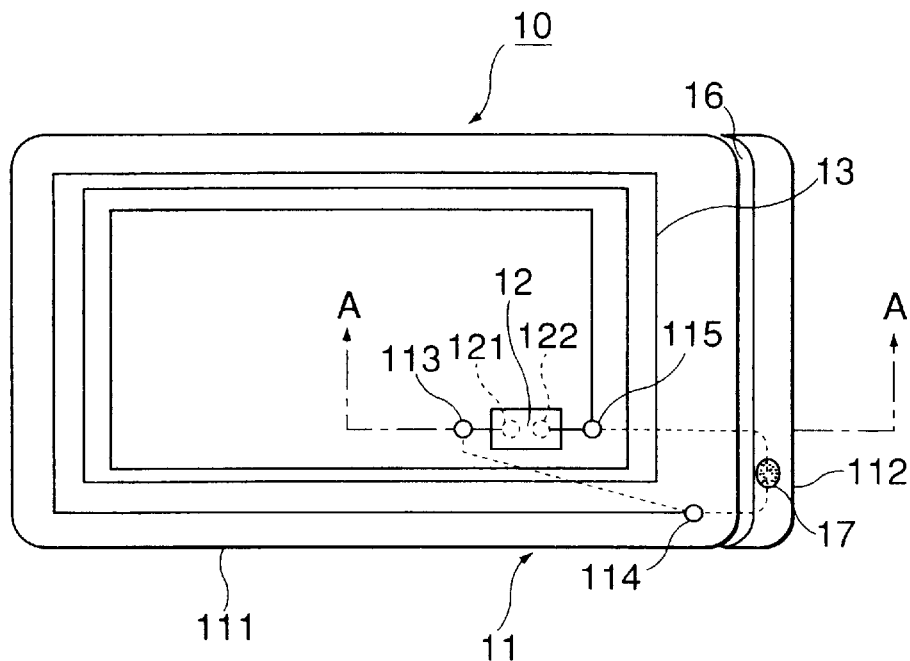
FIG. 9(A) is a plan view of a noncontact IC card of the present invention.
FIG. 9(B) is a sectional view taken on line A—A in FIG. 9(A)
Figure 9:
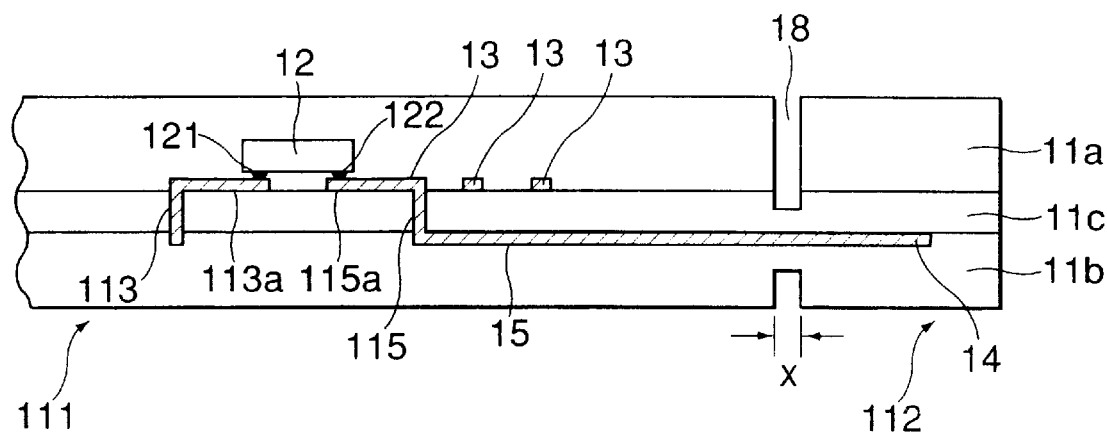
Figure 10:
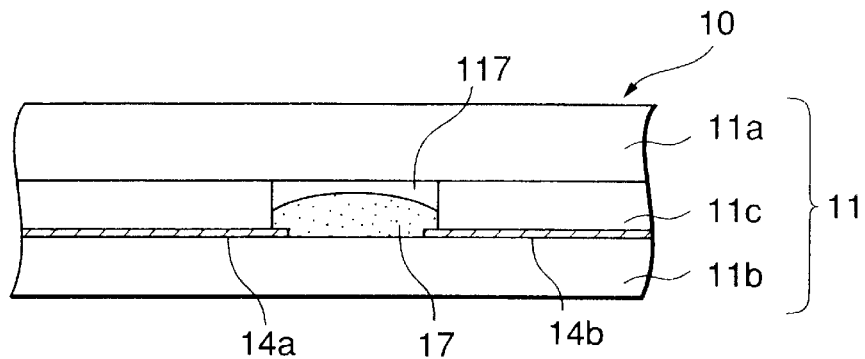
FIGS. 10(A) and 10(B) are typical sectional views of assistance in explaining a method of forming a connecting part.
Figure 10:
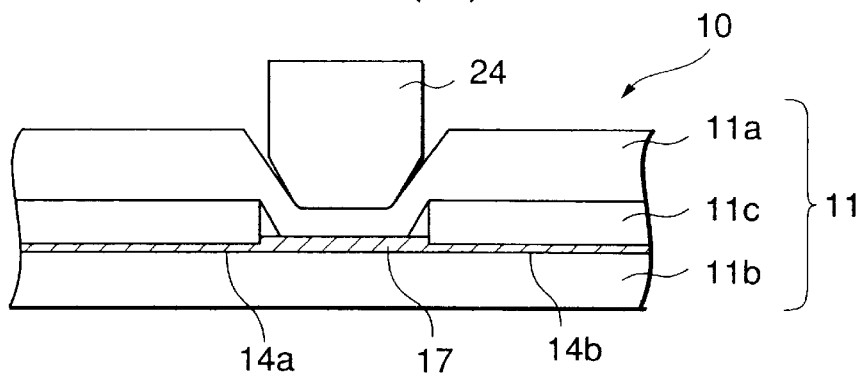
Figure 11:
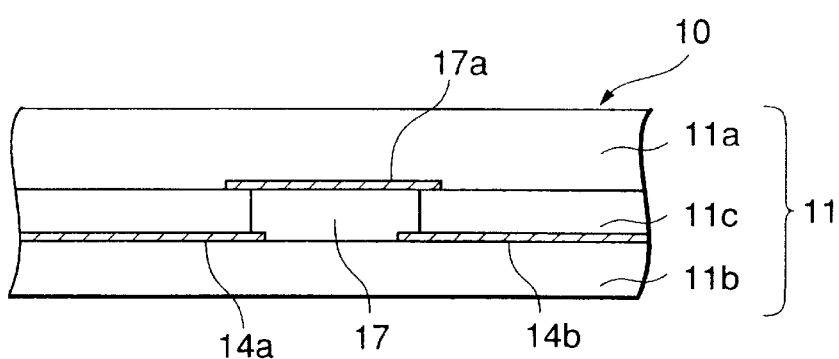
FIGS. 11(A) and 11(B) are typical sectional views of assistance in explaining a method of forming another connecting part.
Figure 11:
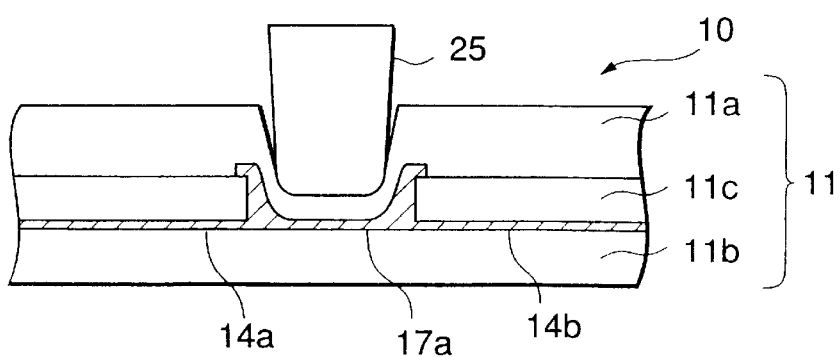
Figure 12:
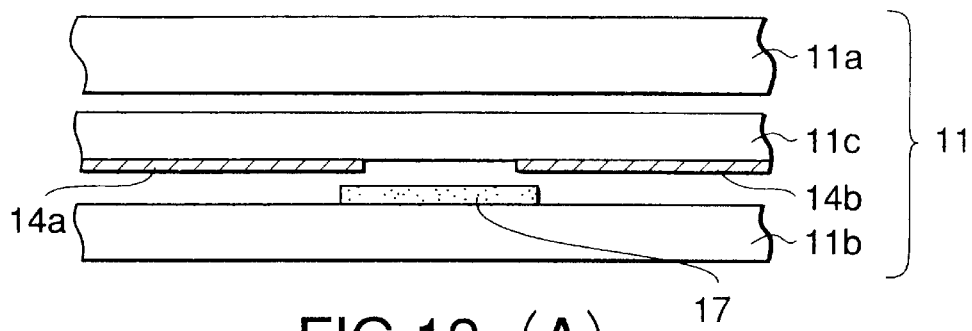
FIGS. 12(A) and 12(B) are typical sectional views of assistance in explaining a method of forming a third connecting part.
Figure 12:
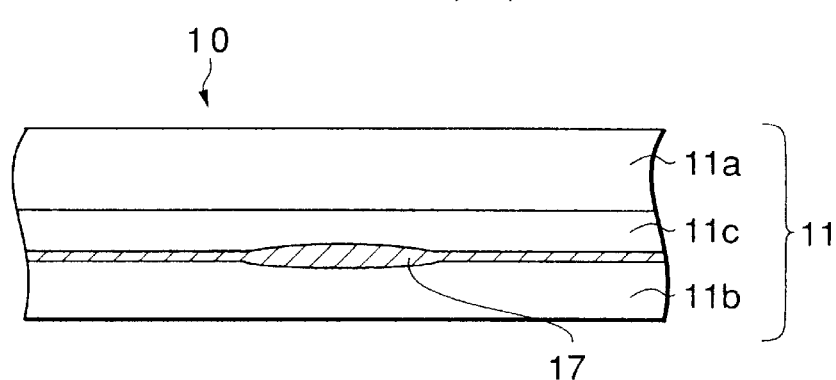
Figure 13:
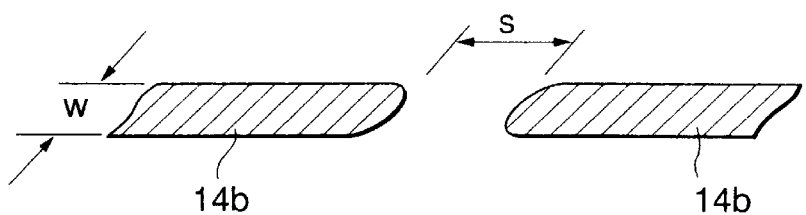
FIGS. 13(A) and 13(B) are typical perspective views of assistance in explaining a connecting part.
Figure 13:
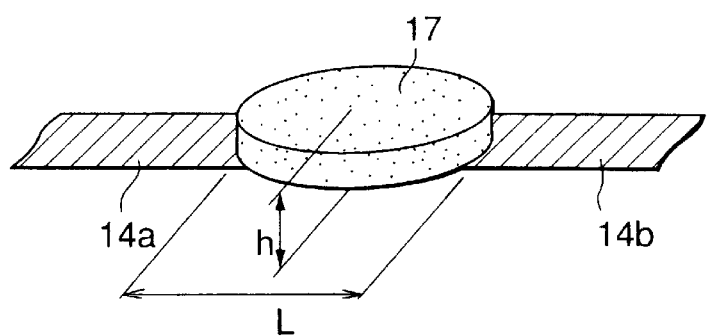
Figure 14:
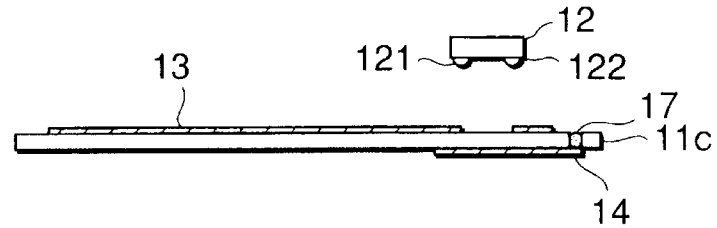
FIGS. 14(A) to 14(D) are views of assistance in explaining a noncontact IC card manufacturing process.
Figure 14:
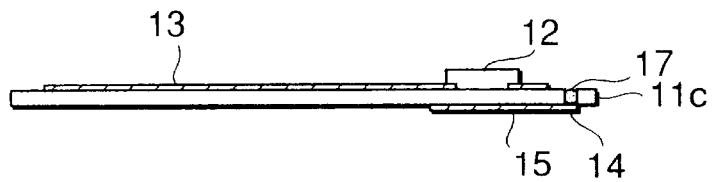
Figure 14:
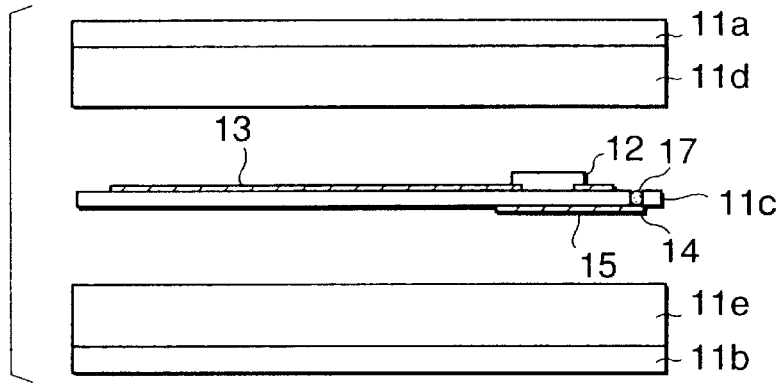
Figure 14:
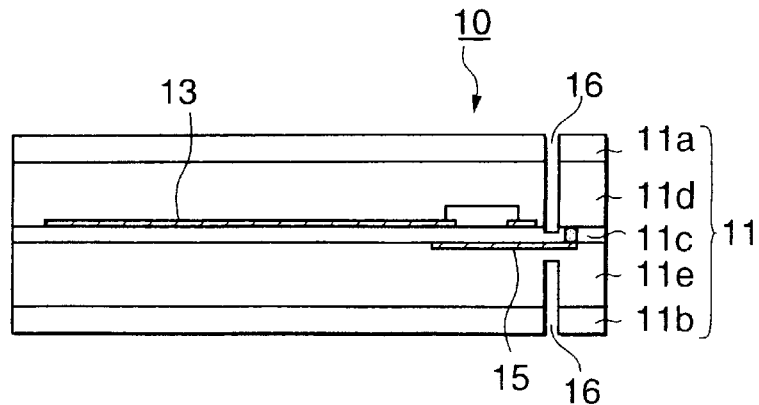

Referring to FIG. 8, the noncontact IC card 10 has an electronic circuit comprising the antenna coil 13 and the IC chip 12. The IC chip 12 comprises a power supply 123, a clock extracting circuit 124, a demodulator 125, a modulator 126, a processor 127 and a memory device 128. The respective inputs and the outputs of the power supply 123, the clock extracting circuit 124 and the demodulator 125 of the IC chip 12 are connected to the antenna coil 13 and the processor 127, respectively. The output of the processor 127 is connected to the input of the modulator 126, and the output of the modulator 126 is connected to the antenna coil 13. The memory device 128 is connected to the processor 127.

The antenna coil 13 is used for both signal transmission and signal reception; that is, data is received from an external reader/writer 132, power is received and data is transmitted to the reader/writer 132 through the antenna coil 13. The power supply 123 connected to the antenna coil 13 supplies power to the processor 127 of the noncontact IC card 10. The clock extracting circuit 124 having the input connected to the antenna coil 13 supplies a clock signal to the processor 127. The demodulator 125 having the input connected to the antenna coil 13 gives demodulated signals which is obtained at the demodulator 125 by modulating signals received from the reader/writer to the processor 127. The processor 127 comprises, for example, a microcomputer. The processor 127 is initialized by a signal given thereto by the power supply 123, uses the clock signal given thereto by the clock extracting circuit 124 for the synchronization of signal processing operations for transmission control, reception control, memory access control and data processing. The processor 127 controls operations for receiving data, and write data to the memory device 128, and operations for reading data from the memory device 128, giving the data to the modulator 126 and transmitting the modulated data through the antenna coil 13 to the reader/writer 132.

FIGS. 9(A) and 9(B) illustrate the construction of the noncontact IC card 10 of FIG. 7. As shown in FIGS. 9(A) and 9(B), the base card 11 of the noncontact IC card 10 has the main part 111, the identification part 112, and the breaking part provided with the folding grooves 16 and extending between the main part 111 and the identification part 112. The folding grooves 16 are formed to reduce the thickness of a part of the base card 11 to form the breaking part which can easily be broken. A perforated line may be formed instead of the groove 16 in the breaking part. The IC chip 12 is mounted on the main part 111. A first bump 121, i.e., one of the bumps, of the IC chip 12 is connected via through holes 113 and 114 to one end of the antenna coil 13, and a second bump 122, i.e., the other bump, of the IC chip 12 is connected via a through hole 115 to the other end of the antenna coil 13. The short-circuiting circuit 14 is provided with the connecting part 17 formed in the identification part 112. The connecting part 17 may be formed in the main part 111 provided that the same can be processed to close the short-circuit circuit 14. The IC chip 12 is mounted on a middle sheet 11c serving as an internal layer of the base card 11, and the antenna coil 13 is formed on the middle sheet 11c. Therefore, the IC chip 12 and the antenna coil 13 are concealed from view.

FIG. 9(B) is an enlarged typical sectional view taken on line A—A in FIG. 9(A). Referring to FIG. 9(B), the base card 11 is formed by sandwiching the middle sheet 11c provided with the printed wiring lines between an upper sheet 11a and a lower sheet 11b to form a layered sheet structure, and laminating the upper sheet 11a, the lower sheet 11b and the middle sheet 11c. The IC chip 12 is provided on its surface facing the middle sheet 11c with the bumps 121 and 122. The first bump 121 is connected to a terminal 113a formed on the middle sheet 11c by wire bonding or an anisotropic conductive film. The second bump 122 of the IC chip 12 is connected to a terminal 115a connected to the antenna coil 13. The second bump 122 is connected via a through hole 115 to the short-circuiting circuit 14. The terminal 113a connected to the first bump 121 is connected via through holes 113 and 114 to the antenna coil 13 and the short-circuiting circuit 14.

The short-circuiting circuit 14 may be formed on either the upper surface, i.e., the surface on the side of the IC chip 12, or the lower surface, i.e., the surface on the opposite side of the IC chip 12, of the middle sheet 11c. If the short-circuiting circuit 14 is formed on the lower surface of the middle sheet 11c, the number of the through holes can be reduced. The short-circuiting circuit 14 may be formed on the lower sheet 11b, provided that the short-circuiting circuit 14 can surely be connected to the IC chip 12.

The connecting part 17 of a solder paste is formed in a part of the short-circuiting circuit 14 formed in the identification part 112. The connecting part 17 may be formed by forming a part of the short-circuiting circuit 14 in line segments lying end to end on the lower sheet 11b, laminating the middle sheet 11c provided with an opening to the lower sheet 11b so that the opposite ends of the line segments are exposed in the opening of the middle sheet 11c, and filling up the opening of the middle sheet 11c with a solder paste to form the connecting part 17. The connecting part 17 also may be formed also by forming the short-circuiting circuit 14 on the middle sheet 11c, forming an opening in the middle sheet 11c to break a part of the short-circuiting circuit 14, and fling up the opening with a solder paste to form the connecting part 17 between the broken ends of the part of the short-circuiting circuit 14. The connecting part 17 may be formed in either the main part 111 or the identification part 112.

The folding grooves 16 must be formed so that the breaking part can easily be broken to separate the identification part 112 from the main part 111 and so that the short-circuiting circuit 14 may not be broken. If a perforated line is formed in the breaking part instead of the folding grooves 16, the short-circuiting circuit 14 should not be broken by the perforated line. The IC chip 12 is surrounded by the antenna coil 13 in a configuration illustrated in FIGS. 9(A) and 9(B), and the same is located beside the antenna coil 13 in a configuration illustrated in FIG. 7. Those configurations are the same in functions. The configuration shown in FIG. 7 in which the IC chip 12 is located beside the antenna coil 13 facilitates the connection of the IC chip 12 and the short-circuiting circuit 14, and needs fewer of through holes.

FIGS. 10(A) and 10(B) illustrate the connecting part 17 of a solder paste before and after a short-circuiting process, respectively. Referring to FIG. 10(A), a part of the short-circuiting circuit 14 has a pair of conductive lines 14a and 14b, and the connecting part 17 is formed between the pair of the conductive lines 14a, 14a to connect the pair of conductive lines 14a and 14b by filling an opening 117 formed in the middle sheet 11c. The connecting part 17 can easily be formed by forming the pair of conductive lines 14a and 14b on the lower sheet 11b, laminating the middle sheet 11c provided with the opening 117 to the lower sheet 11b so that the opposite ends of the pair of conductive lines 14a and 14b lie in the opening 117, and filling the opening with a solder paste.

The solder paste is a viscous creamy substance prepared by mixing solder powder in a viscous flux, such as rosin, containing an organic solvent in a small concentration. The solder powder may be a powder of a prevalently used Sn(63%)/Pb(37%) eutectic solder or may be a powder of such a eutectic solder containing several percent of Bi (bismuth), available on the market. The solder containing Bi has a relatively low melting point, is relatively brittle and has an inferior adhesive property. The solder paste has a relatively large electric resistivity not smaller than 1 k$\Omega$·m because the solder paste is a substance having solder particles of particle size in the range of 20 to 30 $\mu$m dispersed in a flux having a high viscosity at a room temperature. Generally, a wiring line is held in place by the highly viscous solder paste, and the solder paste is heated to a temperature not lower than the melting point of the solder with hot air or infrared rays to fix the wiring line by soldering. The melting point of an Sn/Pb solder having the lowest melting point is about 183° C. Therefore, the solder paste must be heated at 200° C. to melt the solder. Therefore, the connecting part 17 of a solder paste is not affected by a card pressing temperature on the order of 140° C. Once the solder paste is melted and solidified, the electrical connecting part 17 has an electrical resistance substantially equal to zero. Since the solder paste has a high resistance, the pair of conductive lines 14a and 14b connected by the connecting part 17 of the solder paste are not electrically connected. Since the resistance of the antenna coil 13 is lower than that of the connecting part 17 in an initial state before the connecting part 17 is melted and solidified, the signal transmitting and receiving functions of the noncontact IC card 10 are effective in the initial state. A card issuing operation including writing fixed data and personal data to the IC chip 12 is carried out while the connecting part 17 is in the initial state.

When a heating pin 24 is brought into contact with a part of the upper sheet 11a adjacent to the connecting part 17, and the connecting part 17 is heated with the heating pin 24 as shown in FIG. 10(B), the connecting part 17 is melted, and the connecting part 17 solidifies when the temperature thereof drops to a room temperature, and the connecting part 17 is set in a conductive state and becomes conductive. Consequently, the pair of conductive lines 14a and 14b are electrically connected to close the short-circuiting circuit 14. Since the electrical resistance of the connecting part 17 in the conductive state is substantially equal to zero, the electrical resistance of the antenna coil 13 generally in the range of 2 to 3 $\Omega$ or 20 to 30 $\Omega$ is higher than that of the short-circuiting circuit 14. Consequently, the antenna coil 13 is unable to function for signal transmission and reception. Hot air, an infrared beam or a laser beam may be used instead of the heating pin 24 to heat and melt the connecting part 17.

FIGS. 11(A) and 11(B) illustrate a pressing connecting part 17a in a modification of the connecting part 17 in an initial state and a conductive state, respectively.

Referring to FIG. 11(A) the pressing connecting part 17a is formed on the upper surface of the middle sheet 11c to correspond to the opposite ends of the conductive lines 14a and 14b projecting into the opening 117 formed in the middle sheet 11c. When the pressing connecting part 17a is in an initial state as shown in FIG. 11(A), the short-circuiting circuit 14 is open and the predetermined card issuing operation can be carried out to write fixed data and personal data to the IC chip 12.

When a part of the upper sheet 11a corresponding to the pressing connecting part 17a is pressed with a pressing rod 25 as shown in FIG. 11(B), the pressing connecting part 17a formed on the middle sheet 11c is pressed against the conductive lines 14a and 14b in a pressed state to close the short-circuiting circuit 14. Since the electrical resistance of the short-circuiting circuit 14 is lower than the antenna coil 13, the antenna coil 13 is unable to function for signal transmission and reception. Although FIG. 11(B) shows the lower sheet 11b remaining flat, a pressure may be applied to the part of the upper sheet 1a corresponding to the pressing connecting part 17a so that the part of the upper sheet 11a presses the pressing connecting part 17a into the lower sheet 11b.

FIGS. 12(A) and 12(B) illustrate a connecting part 17 of a solder paste in another modification of the connecting part 17 of FIG. 10(A). As shown in FIG. 12(A), the connecting part 17 of a solder paste is formed on the lower sheet 11b, and the conductive lines 14a and 14b are formed on the lower surface of the middle sheet 11c. The middle sheet 11c is sandwiched between the upper sheet 11a and the lower sheet 11b, and the upper sheet 11a, the middle sheet 11c and the lower sheet 11b are laminated to form a laminated structure. When the laminated structure is heated, the solder paste forming the connecting part 17 melts and then solidifies, so that the connecting part 17 becomes conductive. Consequently, the short-circuiting circuit 14 is closed. When the connecting part 17 shown in FIGS. 12(A) and 12(B) is employed, the middle sheet 11c need not be provided with any opening.

All the wiring lines of the short-circuiting circuit 14 may be formed of a solder paste by a screen printing process different from a process of forming other conductive lines. The electrical resistance of the short-circuiting circuit 14 formed entirely of the solder paste is higher than that of the short-circuiting circuit 14 having the connecting part 17 formed of the solder paste. Therefore, the noncontact IC card provided with the short-circuiting circuit 14 formed entirely of the solder paste provides better conditions for the card issuing operation.

Referring to FIGS. 13(A) and 13(B) illustrating the connecting part 17 embodying the present invention, the conductive lines 14a and 14b are formed by etching a metal film, such as an aluminum film or a copper film, of a thickness in the range of 10 to 50 μm. The width w of the conductive lines 14a and 14b is in the range of about 10 to about 100 Mm. The distance s between the opposite ends of the conductive lines 14a and 14b is in the range of about 0.5 to about 5 mm. Preferably, the length L of the connecting part 17 of a solder paste along the distance s is great enough to straddle the gap between the conductive lines 14a and 14b. Preferably, thickness h of the connecting part 17 is in the range of about 1 to about 10 μm.

A method of fabricating the noncontact IC card 10 embodying the present invention will be described below.

FIGS. 14(A) to 14(D) illustrate steps of a method of fabricating the noncontact IC card 10 of the present invention. As shown in FIG. 14(A), the antenna coil 13, the short-circuiting circuit 14, the connecting part 17 of a solder paste and the connecting circuit 15 are formed on the a middle sheet 11c, and the through holes 113, 114 and 115 are formed in the middle sheet 11c. Then, as shown in FIG. 14(B), the IC chip 12 is connected to the antenna coil 13 and the short-circuiting circuit 14 by soldering using solder bumps or by wire bonding. Then, as shown in FIG. 14(C), the middle sheet 11c is sandwiched between the upper sheet 11a and the lower sheet 11b to form a layered sheet structure, and then the layered sheet structure is subjected to hot pressing to laminate the upper sheet 11a and the lower sheet 11b to the middle sheet 11c. The upper sheet 11a and the lower sheet 11b may be provided with adhesive films 11d and 11e, respectively, to facilitate laminating the same to the middle sheet 11c. The upper sheet 11a, the lower sheet 11b and the middle sheet 11c thus laminated form a base card 11. The IC chip 12 is embedded in the base card 11.

Since the thickness of the IC chip 12 not in the form of a module is in the range of 50 to 200 μm, the thickness of the IC chip 12 is absorbed by the upper sheet 11a and the IC chip 12 scarcely affects the appearance of the noncontact IC card 10. If the upper sheet 11a and the lower sheet 11b are laminated to the middle sheet 11c with the adhesive layers 11d and 11e, respectively, the thickness of the IC chip 12 can easily be absorbed by the adhesive layer 11d.

The middle sheet 11c provided with the printed circuits can be fabricated by a known method comprising a step of forming the antenna coil 13 and the terminals 113a and 115a by forming conductive films, such as aluminum films, on both the surfaces of the middle sheet 11c by plating, and etching the conductive films by a photolithographic etching process, a step of forming the through holes 113, 115 and 116, and connecting the circuits formed on the upper and the lower surface of the middle sheet 11c via the through holes 113, 115 and 116. The short-circuiting circuit 14 and the connecting circuit 15 are formed on the lower surface of the middle sheet 11c opposite the upper surface of the same on which the IC chip 12 is attached to avoid contact between the short-circuiting circuit 14 and the connecting circuit 15, and the antenna coil 13. The aluminum films may be of relatively small areas because the circuits have relatively small areas, respectively. The connecting circuit 15 may be formed by applying a conductive material with a dispenser to the middle sheet 11c.

The connecting part 17 of the solder paste may be formed by filling an opening formed in the middle sheet 11c with the solder paste or may be formed on the lower sheet 11b, and the conductive lines 14a and 14b formed on the lower surface of the middle sheet 11c may be connected to the connecting part 17.

The folding grooves 16 are formed in the laminated base card 11 by pressing, spot facing or half punching (FIG. 14(D)). The breaking part provided with the folding grooves 16 may accidentally be broken if the thickness of the breaking part is excessively small. The identification part 112 cannot easily be separated from the main part 111 and the an irregular section may be formed on the main part 111 when the identification part 112 is separated from the main part 1111f the thickness of the breaking part is excessive. It is known empirically that the thickness of a preferable breaking part provided with the folding grooves 16 is in the range of 0.1 to 0.3 mm. Although the identification part 112 may be formed in an optional width, a suitable value of the width W (FIG. 3(C)) of the identification part 112 is in the range of 5 to 20 mm because the identification part 112 must be able to be nipped between fingertips. Generally, a plurality of noncontact IC cards are formed in a sheet, and then the sheet is cut by punching into the plurality of individual noncontact IC cards.

Resins suitable for forming the upper sheet 11a, the lower sheet 11b and the middle sheet 11c are weldable resins including polyvinyl chloride resins, polyethylene resins, polypropylene resins, polystyrene resins, ABS resins, acrylic resins, polyamide resins, polyimide resins and the like. When the upper sheet 11a, the lower sheet 11b and the middle sheet 11c are sheets of a nonweldable polyester resin or a nonweldable polycarbonate resin, the upper sheet 11a, the lower sheet 11b and the middle sheet 11c can be laminated by using an adhesive to construct the base card 11.

EXAMPLE

An example of the noncontact IC card 10 will be described. It is presumed that thirty noncontact IC cards 10 are formed in five rows and six columns on a base sheet. Aluminum films of 20 μm in thickness for forming the antenna coils 13, the short-circuiting circuit 14 and the connecting circuit 15 were formed on both the surfaces, respectively, of a 25 μm thick polyethylene terephthalate film by an electroless plating process and a subsequent electroplating process. The aluminum film formed on the upper surface, i.e., a surface on which the IC chips 12 are to be mounted, was subjected to a photolithographic etching process to form the antenna coils 13 and the terminals 113a and 115a to which the IC chips 12 are to be connected. Each of the antenna coils 13 was formed by winding a 160 μm wide line in four turns at intervals of 160 μm on the middle sheet 11c of the base card 11. The short-circuiting circuits 14 and the connecting circuits 15 were formed by processing the aluminum film formed on the other surface of the middle sheet 11c. The through holes 113 and 115 were formed in the middle sheet 11c, and the surfaces of the through holes 113 and 115 were coated with a conductive film by plating. IC chips 12 provided with a 64-byte memory device were bonded to the terminals 113a and 115a formed on the middle sheet 11c by applying heat and pressure to the bumps 121 and 122 of the IC chips 12 with a heater head. The base sheet can be divided into thirty base cards 11.

A connecting part 17 similar to that shown in FIGS. 12(A) to 13(B) was employed. Conductive lines 14a and 14b of 0.2 mm in width w were formed in each of parts of the polyethylene terephthalate film for the middle sheets 11c, corresponding to separable parts 112. The distance s between the opposite ends of the conductive lines 14a and 14b was 1 mm. A solder paste was printed by a screen printing process on a 100 μm thick polyethylene terephthalate film for lower sheets 11b in thickness h=1 mm and length L=2 mm. The solder paste was RMA type solder paste (available from Senju Kinzoku Kogyo K.K.) prepared by dispersing Sn(63%)/Pb(37%) solder powder in a flux prepared by mixing rosin, an adhesive, an alcohol and the like.

Polyethylene terephthalate films for forming the upper sheets 11a and the lower sheets 11b were coated with a 280 μm thick layer of a polyester adhesive. The polyethylene terephthalate sheet for forming the middle sheets 11c mounted with the IC chips 12 was sandwiched between the polyethylene terephthalate films coated with the polyester adhesive for forming the upper sheets 11a and the lower sheets 11b to form a layered sheet structure. The layered sheet structure was heated at 140° C. and pressed at 25 kg/cm$^2$ for 15 min by a hot press for a laminating process to form a laminated sheet structure of 760 μm in thickness. The polyester adhesive was applied to the inner surface of the polyethylene terephthalate film for the lower sheets 11b so that the connecting parts 17 are not coated with the polyester adhesive. Grooves 16 of 180 μm in depth and 0.5 mm in width x were formed in the upper surface of the laminated sheet structure, and grooves of 300 μm in depth and 0.5 mm in width x were formed in the lower surface of the laminated sheet structure by spot facing. The short-circuiting circuits 14 were embedded in the laminated sheet structure, i.e., the base sheet. Thus, 300 μm thick breaking parts and the identification parts 112 of 10 mm in width W were formed. Then, the laminated sheet structure provided with the grooves 16 was divided by punching into the noncontact IC cards 10 each having the base card 11 having the main part 111 and the identification part 112.

Fixed data and personal data were written to the noncontact IC card 10 thus fabricated by a card issuing operation in a state where the short-circuiting circuit 14 is in an open state, and then the connecting part 17 of the solder paste was made conductive by heating the same with the heating pin 24 to close the short-circuiting circuit 14. The resistance of the closed short-circuiting circuit 14 was substantially zero and that of the antenna coil 13 was 10 Ω, so that the noncontact IC card 10 was inoperative and was unable to communicate with an external device. The noncontact IC card 10 became operative after the identification part 112 had been removed.

The noncontact IC card 10 of the present invention is provided with the short-circuiting circuit 14 which disables the IC chip 12 for communication with an external device. The short-circuiting circuit 14 is kept closed to make the noncontact IC card 10 incapable of communication with an external device. A card issuing operation is carried out to store data in the noncontact IC card 10 while the short-circuiting circuit 14 is open, the short-circuiting circuit 14 is closed by rendering the connecting part 17 conductive after the completion of the card issuing operation, and then the noncontact IC card 10 is passed to a user. Therefore, the circuits of the noncontact IC card 10 including the antenna coil 13 are unable to function and may not be caused to malfunction by an external magnetic field during transportation and before an authorized user starts using the noncontact IC card 10, and the original data stored in the noncontact IC card 10 can be retained perfectly as long as the short-circuiting circuit 14 is closed. The short-circuiting circuit 14 can easily be opened by separating the identification part 112 from the main part 111 to start using the noncontact IC card 10.

The unused state of the noncontact IC card 10 can exactly be identified from the identification part 112 in which a part of the short-circuiting circuit 14 is formed. The identification part 112 once separated from the main part 111 cannot be connected as it was before to the main part 111 and hence the used state of the noncontact IC card 10 not having the identification part 112 can easily be identified. Accordingly, the buyer is able to avoid being swindled by buying a used noncontact IC card 10 as a unused noncontact IC card 10, and is able surely to buy a unused noncontact IC card 10.

What is claimed is:

1. A noncontact IC device comprising:
    a base card;
    an IC chip mounted on the base card;
    an antenna coil formed on the base card and connected to the IC chip; and
    a short-circuiting circuit capable of disabling the IC chip for operation when closed and of enabling the IC chip to operate when opened, and
    the base card has a main part, a removable identification part, and a breaking Part provided with folding grooves and connecting the main part and the identification part, the IC chip and the antenna coil are placed in the main part, and a part of the short-circuiting circuit is formed in the identification part.

2. The noncontact IC device according to claim 1, wherein the IC chip and the antenna coil are sealed integrally in a resin.

3. The noncontact IC device according to claim 1, wherein the short-circuiting circuit has an open circuit between a pair of conductive lines, and a connecting part disposed between the pair of conductive lines of the open circuit, said contacting part being capable of closing the open circuit.

4. The noncontact IC device according to claim 3, wherein the connecting part of the short-circuiting circuit is formed of a solder paste having electrical resistance which can be reduced when the solder paste is melted and then solidified.

5. The noncontact IC device according to claim 4, wherein the solder paste comprises a flux and a solder powder in the flux.

6. The noncontact IC device according to claim 3, wherein the connecting part is a press connecting part separated from open circuit and can be connected to the open circuit when pressed into contact with the pair of conductive lines.

7. The noncontact IC device according to claim 3, wherein the base card has a main part, a removable identification part, and a breaking part provided with folding grooves and connecting the main part and the identification part, the IC chip and the antenna coil are located in the main part, and a part of the short-circuiting circuit is formed in the identification part.

8. The noncontact IC device according to claim 7, wherein the connecting part is formed in the identification part.

9. The noncontact IC device according to claim 1, wherein the short-circuiting circuit comprises a solder paste having electrical resistance which is reduced when the solder paste is melted and then solidified.

10. The noncontact IC device according to claim 9, wherein
    the base card has a main part, a removable identification part, and a breaking part provided with folding grooves and connecting the main part and the identification part, the IC chip and the antenna coil are located in the main part, and a part of the short-circuiting circuit is formed in the identification part.

11. The noncontact IC device according to claim 1, wherein
   a part of the short-circuiting circuit is located on a surface of the base card.

12. The noncontact IC device according to claim 1, wherein
   the short-circuiting circuit comprises a volatile material which can be cut with a laser beam.

13. A noncontact IC device comprising:
   a base card;
   an IC chip mounted on the base card;
   an antenna coil formed on the base card and connected to the IC chip; and
   a short-circuiting circuit capable of disabling the IC chip for operation when closed and of enabling the IC chip to operate when opened, and
   the short-circuiting circuit has an open circuit between a pair of conductive lines, and a connecting part disposed between the pair of conductive lines of the open circuit, said connecting part being capable of closing the open circuit.

14. The noncontact IC device according to claim 13, wherein
   the base card has a main part, a removable identification part, an a breaking part provided with folding grooves and connecting the main part and the identification part, the IC chip and the antenna coil are placed in the main part, and a part of the short-circuiting circuit is formed in the identification part.

15. The noncontact IC device according to claim 13, wherein
   the IC chip and the antenna coil are sealed integrally in a resin.

16. The noncontact IC device according to claim 13, wherein
   the connecting part of the short-circuiting circuit is formed of a solder paste having electrical resistance which is reduced when the solder paste is melted and then solidified.

17. The noncontact IC device according to claim 16, wherein
   the solder paste comprises a flux and a solder powder in the flux.

18. The noncontact IC device according to claim 13, wherein
   the connecting part is a press connecting part separated from the open circuit and can be connected to the open circuit when pressed into contact with the pair of conductive lines.

19. The noncontact IC device according to claim 13, wherein
   the base card has a main part, a removable identification part, and a breaking part provided with folding grooves and connecting the main part and the identification part, the IC chip and the antenna coil are located in the main part, and a part of the short-circuiting circuit is formed in the identification part.

20. The noncontact IC device according to claim 19, wherein
   the connecting part is formed in the identification part.

21. The noncontact IC device according to claim 13, wherein
   the short-circuiting circuit comprises a solder paste having electrical resistance which is reduced when the solder paste is melted and then solidified.

22. The noncontact IC device according to claim 21, wherein
   the base card has a main part, a removable identification part, and a breaking part provided with folding grooves and connecting the main part and the identification part, the IC chip and the antenna coil are located in the main part, and a part of the short-circuiting circuit is formed in the identification part.

23. The noncontact IC device according to claim 13, wherein
   a part of the short-circuiting circuit is located on a surface of the base card.

24. The noncontact IC device according to claim 13, wherein
   the short-circuiting circuit comprises a volatile material which can be cut with a laser beam.

25. An IC device for transmitting signals to and receiving signals from an external device, which comprises:
   a base member,
   said base supporting communications means and a short-circuiting circuit,
   said communications means for transmitting signals to and receiving signals from an external device,
   said communications means including an IC chip for controlling transmitted signals and received signals, and
   said short-circuiting circuit for disabling said IC chip when said short-circuiting circuit is closed.

26. The IC device of claim 25, wherein said short-circuiting circuit is removable from the remainder of the IC device, whereby the remainder of the IC device is then able to communicate because the short-circuiting circuit is open.

27. The device of claim 26, wherein said removable part of said short-circuiting circuit from the remainder of the IC device is defined by grooves formed in said base.

28. The device of claim 25, wherein the IC device is in card form.

29. The device of claim 25, wherein the device is capable of transmitting signals to and receiving signals from an external deice without being in physical contact therewith.

30. The device of claim 29, wherein said communication means includes an antenna.

31. The device of claim 30, wherein said antenna and said IC chip form an IC module.

32. The device of claim 25, wherein said base member comprises a middle sheet, an upper sheet, and a lower sheet, whereby said communications means and short-circuiting circuit are formed on the middle sheet so that said IC chip and said communications means are concealed by said upper sheet and said lower sheet.

33. The device of claim 25, further comprising:
   a connecting part, formed in a part of said short-circuiting circuit, being in a nonconductive initial state and capable of being set in a conductive state so that said short-circuiting circuit is closed.

34. The device of claim 33, wherein aid connecting part has high resistance sufficient to keep said short-circuiting circuit in a nonconductive state.

35. The device of claim 34, wherein said high resistance part is a solder paste.

36. The device of claim 35, wherein said solder paste forms all the wiring lines of said short-circuit circuit.

37. The device of claim 33, wherein said connecting part is isolated spatially so that said short-circuiting circuit is open as an initial state, and said short-circuit circuit becomes closed when said connecting part is pressed into an opening in the wiring line of the short-circuiting circuit.

38. An IC card for transmitting signals to and receiving signals from an external device, which comprises:

a base member, said base supporting communications means and a short-circuiting circuit and configured in card form, said communications means for transmitting signals to and receiving signals from an external device without physical contact, said communications means including an IC chip for controlling transmitted signals and received signals, said short-circuiting circuit for disabling said IC chip when said short-circuiting circuit is closed, and said short-circuiting circuit being removable from the remainder of the IC device, whereby the remainder of the IC device is then able to communicate because the short-circuiting circuit is open.

39. An IC card of claim 38 wherein:

said base comprises a middle sheet, an upper sheet, and a lower sheet, and said communications mean and short-circuiting circuit are formed on the middle sheet so that said communications means and said short-circuiting circuit are concealed by said upper sheet and said lower sheet.

40. An IC card for transmitting signals to and receiving signals from an external device, which comprises:

a base member, said base supporting communications means and a short-circuiting circuit and having a configuration of a card form, said communications means for transmitting signals to and receiving signals from an external device without physical contact, said communications means including an IC chip for controlling transmitted signals and received signals, said short-circuiting circuit for disabling said IC chip when said short-circuiting circuit is closed, a connecting part, formed in a part of said short-circuiting circuit, being in a nonconductive initial state and capable of being set in a conductive state so that said short-circuiting circuit is closed, and said short-circuiting circuit being removable from the remainder of the IC device, whereby the remainder of the IC device is then able to communicate because the short-circuiting circuit is open.

41. An IC card of claim 40 wherein:

said base comprises a middle sheet, an upper sheet, and a lower sheet, and said communications mean and short-circuiting circuit are formed on the middle sheet so that said communications means and said short-circuiting circuit are concealed by said upper sheet and said lower sheet.

* * * * *